United States Patent
Lyons et al.

(10) Patent No.: US 6,287,959 B1
(45) Date of Patent: Sep. 11, 2001

(54) DEEP SUBMICRON METALLIZATION USING DEEP UV PHOTORESIST

(75) Inventors: Christopher F. Lyons, Fremont; Bhanwar Singh, Morgan Hill, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/065,352

(22) Filed: Apr. 23, 1998

(51) Int. Cl.$^7$ .................................................. H01L 21/4763
(52) U.S. Cl. .................. 438/636; 438/631; 438/634; 438/637; 438/783; 438/786; 438/952; 438/970
(58) Field of Search ..................... 438/631, 634, 438/636, 637, 783, 786, 952, 970

(56) References Cited

U.S. PATENT DOCUMENTS

| | | |
|---|---|---|
| 4,543,707 | 10/1985 | Ito et al. . |
| 5,600,165 | 2/1997 | Tsukamoto et al. . |
| 5,858,870 | 1/1999 | Zheng et al. . |

FOREIGN PATENT DOCUMENTS

| | | |
|---|---|---|
| 0 525 464 A1 | 2/1993 | (EP) . |
| WO 97/28563 | 8/1997 | (WO) . |

OTHER PUBLICATIONS

PCT International Search Report, International Application No. PCT/US99/07361, International Filing Date Jan. 4, 1999, 4 pages.

*Primary Examiner*—John F. Niebling
*Assistant Examiner*—David A. Zarneke
(74) *Attorney, Agent, or Firm*—Eschweiler & Associates, LLC

(57) ABSTRACT

Reflection of incident optical radiation from a highly reflective metal layer (12), such as aluminum, copper or titanium, into a photoresist layer (16) is reduced by interposing a layer of silicon oxynitride (14) between the metal and photoresist layers. The silicon oxynitride layer (14) is pre-treated with an oxidizing plasma to deplete surface nitrogen and condition the silicon oxynitride layer (14) to be more compatible with deep ultraviolet photoresists. The silicon oxynitride layer (14) further serves as an etch stop in the formation of interconnect openings (40), such as vias, contacts and trenches. The interconnect opening (40) is filled with a second metallization layer to achieve multi-layer electrical interconnection.

14 Claims, 1 Drawing Sheet

DEEP SUBMICRON METALLIZATION USING DEEP UV PHOTORESIST

BACKGROUND OF THE INVENTION

1. Field of the Invention

The present invention relates to photolithographic techniques in semiconductor processing, and, more particularly, to the deposition of deep submicron metallization within high aspect ratio semiconductor structures.

2. Description of the Related Art

In the construction of integrated circuit devices, one or more metallic layers, such as aluminum, copper or titanium, are deposited and subsequently patterned to provide ohmic or Schottky contacts and electrical connections between various circuit elements. Conventionally, photoresist is spun over the metallic layer and then exposed to a light pattern and developed. The normally aluminum metallic layer is then selectively plasma-etched with chlorine-containing gases through the openings in the resist layer. The remaining photoresist is then removed, leaving the final metal pattern.

Antireflective coatings (ARC's) have been applied over reflective surfaces such as aluminum, copper or titanium to improve resist patterning control by reducing interference effects and diffuse scattering, particularly if the illumination source used is monochromatic. Such effects have become less and less tolerable, however, as linewidth and pitch have been reduced in newer integrated circuit designs of greater density.

One approach to reduce the reflected light has been to use metal or refractory materials as antireflective films on aluminum. The titanium nitride films currently used for metal layer antireflective coatings and via etch stop functions, however, are not compatible with deep layer ultraviolet photoresists. As integrated circuit design geometries shrink, deep level ultraviolet photolithography has been used to deposit metals in trenches, contacts and/or via structures. The use of silicon oxynitride as an antireflective coating has been proposed by Gocho et al. in "Chemical Vapor Deposition of Anti-Reflective Layer Film for Excimer Laser Lithography," Japanese Journal of Applied Physics, Vol. 33, Part 1, No. 1B, pp. 489–494 (January 1994). However, no reference was made to the use of silicon oxynitride films for multi-layer interconnect structures now being used in high density integrated circuit manufacturing.

In order to manufacture multi-layer interconnect structures, embedded or burried trenches, vias and/or contacts have been created to achieve electrical contact between layers of metal interconnect. In order to employ such structures within the multiplicity of layers deposited to form an integrated circuit, it is necessary to accurately control and stop certain photolithographic steps from penetrating beyond the precise layers being connected to each other. Etch stopping agents are commonly used to prevent such effects. The prior art, however, does not address the use of silicon oxynitride as an etch stop in the formation of such structures.

Further, Sturtevant et al. in "Substrate Contamination Effects in the Processing of Chemically Amplified DUV Photoresists," SPIE, Vol. 2197, pp. 770–780, and Usijima et al. in "Effects of Substrate Treatment in Positive Chemically-Amplified Resist," SPIE, Vol. 2438, pp. 529–539, address the use of oxidizing plasmas to treat metallic surfaces. However, neither of these references specifically address the use of oxidizing plasmas to treat silicon oxynitride surfaces. One approach to the use of oxidizing plasmas to treat silicon oxynitride surfaces is disclosed in co-pending application Ser. No. 08/857,055, entitled "Process For Forming Bottom Anti-Reflection Coating For Semiconductor Fabrication Photolithography Which Inhibits Photoresist Footing," filed on May 15, 1997, and commonly owned by the assignee of the present application, the contents of which are hereby incorporated herein by reference.

What is lacking in the art is the use of silicon oxynitride films both as antireflective coatings and etch stops within deep submicron metallization structures in semiconductor integrated circuits. Such structures are commonly patterned using photoresists having deep ultraviolet wavelengths, which are prone to be reflected by metallic surfaces and which must be properly controlled in the creation of interconnect vias and contacts.

SUMMARY OF THE INVENTION

In view of the above, it is an object of the present invention to provide an improved process for production of integrated circuit structures wherein light reflection into a photoresist from a highly reflective surface is minimized during photolithographic exposure of deep ultraviolet photoresists.

It is another object of the present invention to provide a process for reducing light reflection into a photoresist layer from an aluminum or copper layer during the creation of deep submicron metallization layers.

It is a further object of the present invention to provide a process for providing an effective etch stop over a metal layer having deep submicron dimensions where deep ultraviolet photoresists are used.

Briefly, in accordance with the invention, a highly reflective layer, such as aluminum, copper or titanium, is coated with a layer of silicon oxynitride (SiON) film. The silicon oxynitride film is formed to a thickness and chemical composition which will provide for strong absorbance of the deep ultraviolet wavelengths used in photolithography and to act as an etch stop. The surface of the silicon oxynitride film is prepared to be more compatible with the deep ultraviolet photoresist through the use of an oxidizing plasma. The metal layer is then patterned using deep ultraviolet photoresist, the silicon oxynitride film is etched away to expose the underlying metal and the metal is processed by conventional metal etch techniques. In an alternate embodiment of the invention, the silicon oxynitride layer is deposited on top of and in addition to a titanium nitride film deposited above the aluminum metallization. The via etch stop processing is performed by using high carbon to fluorine ratio gases. After the etch stops at the silicon oxynitride film, a second etch is performed to remove the silicon oxynitride film. Via metal deposition and planarization steps follow.

Other objects, features and advantages of the present invention will become apparent upon consideration of the following detailed description of the presently preferred embodiments of the invention together with the accompanying drawings.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE PRESENTLY PREFERRED EMBODIMENTS OF THE INVENTION

Figure 1:
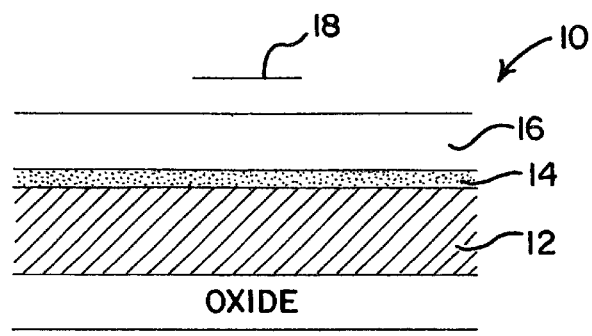
FIG. 1 is a cross-sectional view of a portion of an integrated circuit structure illustrating the deposition of deep ultraviolet photoresist over a silicon oxynitride film.

Reference is now made to the drawings, where like reference numerals refer to like elements throughout. FIG. 1 depicts a cross-sectional view of a portion of an integrated circuit structure, shown generally at 10, having a highly reflective metal layer 12 formed thereon. Metal layers particularly benefited by the practice of the invention include aluminum, copper and titanium, and accordingly, these layers are preferred.

The metal layer 12 is formed in accordance with conventional present practice, and thus does not form a part of this invention. While the metal layer 12 is described herein as preferably comprising aluminum, copper or titanium, it will be appreciated that the teachings of the invention are applicable to layers of other reflective materials, such as tungsten and titanium on polysilicon, which are to be patterned using photolithographic processes.

While it is desired to form a photoresist layer 16 on the metal layer 12 as part of the patterning process, it has been shown that reflective light from the surface of the metal layer 12 interferes with high resolution optical lithography. Accordingly, an antireflective layer 14 is first formed on the surface of the metal layer 12. The photoresist layer 16 is then formed on the surface of the antireflective layer 14. The photoresist layer 16 is formed by deep ultraviolet wavelength photolithography techniques in order to achieve sufficient coverage in highly dense, high aspect ratio, deep submicron interconnect structures.

In accordance with the invention, the antireflective layer 14 comprises silicon oxynitride (SiON). The thickness to which the SiON layer 14 is formed and the chemical composition of the SiON layer 14 are controlled to allow strong absorbance of the deep ultraviolet wavelength used for deep submicron photolithography. The thickness and chemical composition of the SiON layer 14 is also chosen to allow for stopping of an oxide etch. The presently preferred process for depositing the SiON layer 14 employs plasma-enhanced chemical vapor deposition (CVD) from a suitable source. The surface of the SiON layer 14 is also treated with an oxidizing plasma (not shown) to deplete the surface of the SiON layer 14 of nitrogen content, thereby making the SiON layer 14 more compatible with the use of deep ultraviolet photoresist 16.

A mask 18 is used to deposit and pattern the photoresist layer 16 in a manner generally known in the art. After resist exposure, the resist layer 16 is developed in a conventional solvent to remove those portions of the exposed resist. Those portions of the SiON layer 14 and metallization layer 12 underlying the portions of exposed resist 16 are etched. Etching of the SiON layer 14 is preferably done by plasma etching in a fluorine-containing gas.

Figure 2:
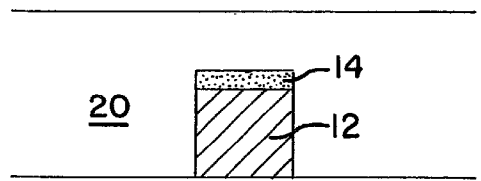
FIG. 2 illustrates the etching away of the deep ultraviolet photoresist.

Following the SiON etch, an oxide ILD layer 20 is deposited. The oxide ILD layer 20 covers and surrounds the etched metal layer 12 and silicon oxynitride layer 14. The oxide ILD layer 20 is then polished in a conventional manner. FIG. 2 depicts the cross-sectional view of the integrated circuit structure at this state in the processing.

Figure 3:
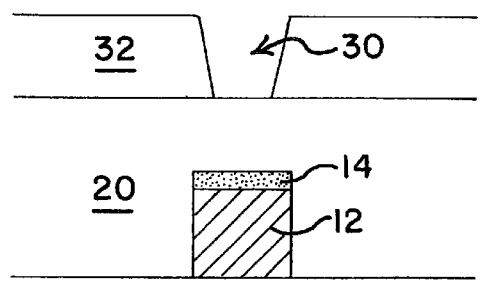
FIG. 3 shows the application of a mask to pattern a via structure.
Figure 4:
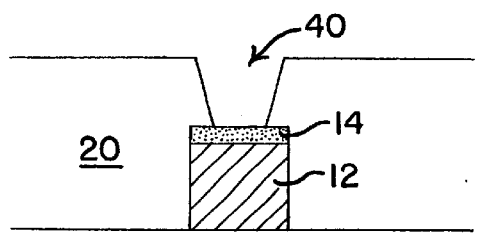
FIG. 4 illustrates the etching of the via, which is stopped at the silicon oxynitride layer.

Referring to FIG. 3, a via mask 32 is then used to pattern a via, contact or trench over the metallization layer 12. As those skilled in the art will appreciate, the via, contact or trench is created in order to achieve electrical connection between multiple interconnect layers within the integrated circuit structure. Accordingly, the via mask 32 includes a via opening 30 used to define the via, contact or trench. A lithium ion type etch is then preferably performed into the oxide ILD layer 20 in order to create an interconnect opening 40. In accordance with the teachings of the invention, the etch is stopped once the lithium ion gas encounters the SiON layer 14. The resulting structure is depicted in cross-section in FIG. 4.

Figure 5:
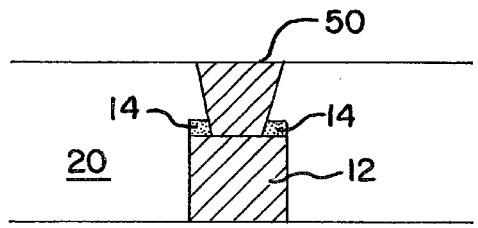
FIG. 5 depicts the deposition of a plug to fill the via to achieve electrical contact with the underlying metallization layer.

As shown in FIG. 5, the SiON layer 14 previously deposited over the metallization layer 12 is partially etched as described above in order to penetrate through the SiON layer 14. Enough penetration is required to allow electrical contact with the metallization layer 12. Once the interconnect opening 40 has been etched, and the SiON layer 14 has been sufficiently cleaned away, a second metallization layer 50 is deposited in a conventional manner. The second metallization layer 50 creates a "plug" within the interconnect opening 40, as shown in FIG. 5. Once the second metallization layer 50 has been deposited, conventional planarization follows. As those skilled in the art will appreciate, the above-described process can be repeated many times in order to build up the necessary layers of interconnect required for a particular integrated circuit structure.

In an alternate embodiment of the invention, the SiON layer 14 can be deposited on top of and in addition to a titanium nitride layer (not shown). In this alternate embodiment, the titanium nitrate layer would be deposited above the metallization layer 12 shown in FIGS. 1–5.

As can be seen, the use of silicon oxynitride can be employed as a successful anti-reflective coating over deep submicron metallization layers. The properties of silicon oxynitride make is particularly compatible with deep ultraviolet photoresists used to pattern highly dense interconnect structures. Silicon oxynitride can also be employed as a successful etch stop in the patterning of such deep submicron metallization layers.

The foregoing description of the preferred embodiments of the present invention has been presented for purposes of illustration and description. It is not intended to be exhaustive or to limit the invention to the precise form disclosed. Many modifications and variations will be apparent to practitioners skilled in the art. It is possible that the invention may be practiced in other fabrication technologies in MOS or bipolar processes.

Similarly, any process steps described might be interchangeable with other steps in order to achieve the same result. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method for depositing metal in deep submicron semiconductor structures, comprising the steps of:
depositing a silicon oxynitride film over a first metallization layer;
conditioning the silicon oxynitride film to deplete surface nitrogen content;
patterning the first metallization layer using deep ultraviolet photolithography;
etching the first metallization layer;
depositing and masking a dielectric layer;
etching an opening through the dielectric layer; and
stopping the etching of the dielectric layer upon encountering the silicon oxynitride film.

2. The method defined in claim 1, further comprising the step of depositing a second metallization layer.

3. The method defined in claim 1, wherein the first metallization layer comprises aluminum.

4. The method defined in claim 1, wherein the first metallization layer comprises copper.

5. The method defined in claim 1, wherein the thickness and chemical composition of the silicon oxynitride layer are selected to allow for strong absorbance of deep ultraviolet radiation and to allow stopping of a reactive ion etch.

6. The method defined in claim 1, wherein the surface of the silicon oxynitride is conditioned with an oxidizing plasma to deplete surface nitrogen content.

7. The method defined in claim 1, wherein the first metallization layer is etched using conventional metal etch processing.

8. The method defined in claim 1, further comprising the step of planarizing the dielectric layer.

9. The method defined in claim 1, wherein the interlayer opening comprises a via.

10. The method defined in claim 1, wherein the interlayer opening is formed using a high carbon to fluorine ratio gas composition.

11. The method defined in claim 10, wherein the gas composition allows selectivity between the dielectric layer and the silicon oxynitride film.

12. The method defined in claim 1, wherein the dielectric layer comprises silicon dioxide.

13. The method defined in claim 1, wherein the first metallization layer is deposited using plasma enhanced chemical vapor deposition.

14. The method defined in claim 1, wherein the method is repeated to create successive layers of interconnect.

* * * * *